United States Patent [19]

Stern et al.

[11] 4,066,984

[45] Jan. 3, 1978

[54] SURFACE ACOUSTIC WAVE DEVICES FOR PROCESSING AND STORING SIGNALS

[76] Inventors: Ernest Stern, 31 Oxbow Road, Concord, Mass. 01742; Kjell A. Ingebrigtsen, Einar Ofstis vei 27, 7000 Trondheim, Norway

[21] Appl. No.: 713,497

[22] Filed: Aug. 11, 1976

[51] Int. Cl.[2] .................... G06F 15/34; G06G 7/19; H01L 29/48; H03H 9/30

[52] U.S. Cl. .............................. 333/30 R; 235/181; 310/313; 333/72; 357/15; 357/26; 357/51; 365/175; 310/366

[58] Field of Search .................... 333/30 R, 72, 70 R, 333/70 A, 70 T; 328/167; 310/8, 8.1, 8.2, 51, 15; 357/47, 26; 235/181; 340/173 R

[56] References Cited

U.S. PATENT DOCUMENTS

| | | | |
|---|---|---|---|
| 3,858,231 | 12/1974 | Magdo et al. .................... | 357/47 X |
| 3,975,696 | 8/1976 | Kantorowicz .................... | 333/30 R |

OTHER PUBLICATIONS

Bers et al.—"Surface Statememory in Surface Acoustoelectric Correlator" in Applied Physics Letters, vol. 25, No. 3, Aug. 1, 1974; pp. 133–135.

Stern et al.—"New Adaptive-Signal-Processing Concept" in Electronics Letters, Mar. 7, 1974, vol. 10, No. 5; pp. 58–59.

Ingebrigtsen et al.—"A Schottky-Diode Acoustic Memory and Correlator" in Applied Physics Letters, vol. 26, No. 11, June 1, 1975; pp. 596–598.

*Primary Examiner*—Alfred E. Smith
*Assistant Examiner*—Marvin Nussbaum
*Attorney, Agent, or Firm*—Robert F. O'Connell

[57] ABSTRACT

A surface acoustic wave device utilizing a piezoelectric substrate capable of propagating traveling acoustic waves along a surface thereof and a semiconductive substrate positioned adjacent such surface, the latter substrate having an array of Schottky diodes and associated islands of highly resistive material, such as polycrystalline silicon material, disposed in the surface thereof opposite the piezoelectric substrate to form an interaction region. Application of a signal uniformly over the interaction region will charge the diodes uniformly and an acoustic wave traveling along a selected surface of the piezoelectric substrate will interact with the uniformly applied signal to alter the charging pattern of the Schottky diode array in accordance therewith to produce a corresponding altered conductivity pattern stored in the semiconductor substrate and representing the interaction of the uniformly applied signal and the traveling wave signal. A second signal can thereupon be propagated along the piezoelectric substrate to interact with the stored altered conductivity pattern to provide either correlation or convolution operation depending on the direction of propagation thereof along the piezoelectric surface.

Improvement in the stored signal to noise ratio can be obtained by applying the signal to be stored and the uniformly applied signal a selected number of times over a selected time interval to maximize the charge on the diodes so that when the stored signal is read out the signal to noise ratio at read-out is also improved.

Further, a plurality of signals can be simultaneously stored in substantially the same space in the semiconductor substrate by tilting the direction of propagation thereof or by using coded wavefront patterns thereof to provide orthogonal beams which prevent interaction, or cross-talk, therebetween.

17 Claims, 8 Drawing Figures

SURFACE ACOUSTIC WAVE DEVICES FOR PROCESSING AND STORING SIGNALS

The Government has rights in this invention pursuant to Contract No. F19628-76-C-0002 (AF) awarded by the Department of the Air Force.

INTRODUCTION

This invention relates generally to surface wave devices for the processing and storing of signals and, more particularly, to the use of diode means, such as Schottky diodes, having increased storage times for improving such signal processing and storage operations.

BACKGROUND OF THE INVENTION

Signal processing devices have been suggested by the prior art for providing for the processing and storage of signals by utilizing a piezoelectric substrate capable of propagating acoustic wave signals on a selected surface thereof and a semiconductor substrate positioned adjacent and spaced from such surface. Appropriate techniques are utilized for altering the conductivity pattern in the semiconductor substrate in accordance with the wave form of an acoustic wave signal that is propagated along the selected surface of the piezoelectric substrate so that a representation of the acoustic wave signal is effectively and temporarily stored therein. Such techniques for altering the conductivity pattern include applying a signal uniformly over the interaction region which comprises the regions at or near the surfaces of the substrates and the spatial region therebetween so that a second signal which is propagated along the surface of the piezoelectric material interacts with the uniformly applied signal to alter the conductivity pattern in the semiconductor substrate, the altered conductivity pattern representing the stored propagated signal. A further signal subsequently propagated along the piezoelectric substrate surface thereupon interacts with the stored altered conductivity pattern, the interaction thereby producing an output signal at an electrode of the semiconductor substrate which represents the correlation of the convolution of the two interacting signals depending on the direction of propagation of the further signal along the piezoelectric surface. Certain structural embodiments of such technique have been discussed in the articles of Stern and Williamson, "New Addaptive-Signal-Processing Concept" in Electronic Letters, Vol. 10, No. 5, dated 7 March 1974, and of Bers and Cafarella, "Surface State Memory in Surface Acoustoelectric Correlator", Applied Physics Letters, Vol. 25, No. 3, dated August 1, 1974, and in the copending applications, Ser. No. 555,367 of Stern et al., filed on Mar. 5, 1975, and now U.S. Pat. No. 4,016,412; Ser. No. 672,345 of Stern et al., filed on Mar. 31, 1976; and Ser. No. 672,344 of Stern et al., filed on Mar. 31, 1976.

The major problems with such devices have been that a relatively long time period is required in order to store a signal in the form of such altered stationary conductivity pattern in the previously disclosed embodiments and, once stored, the signal can remain stored therein only for a relatively short time period. In utilizing trap techniques, as disclosed in the above Bers et al. article and the patent applications, for example, the time required to store a signal may be in the order of 0.1 to 1 microsecond ($\mu$ sec.), while the signal can be held in storage only for about 0.1 to 1 millisecond (msec.), or less. The usefulness of such devices thereby becomes limited because of the relatively long storing or "write" time period and the relatively short storage time period.

Another embodiment of such technique for improving the write and storage time periods of these devices is disclosed in the article of Ingebrigtsen et al., "A Schottky-Diode Acoustic Memory and Correlator," Applied Physics Letters, Vol. 26, No. 11, dated June 1, 1975, and in the copending application Ser. No. 690,601 of Stern et al., filed May 27, 1976. In a preferred embodiment discussed in such article and application an array of diodes, such as Schottky diodes, are formed in appropriate holes in a thermally grown silicon dioxide layer which is present on a selected surface of a substrate of semiconductor material, such as n-type silicon, and an island, or overlay, comprising a conductive material, for example, a metal such as gold, is formed over each of the diodes of the array to increase the capacitances thereof. An interaction region thereby exists which region includes the regions at or near the adjacent surfaces of the substrates and the spatial region therebetween. A signal applied uniformly over the interaction region to produce time varying properties thereof provides a substantially uniform charge on each of the diodes.

A surface wave signal which is propagated along the adjacent surface of the piezoelectric substrate thereby interacts with the uniformly applied signal so as to alter the charge placed on the Schottky diodes, which interaction induces further charges proportional to the amplitude of the propagated signal on the diodes so as to alter the uniform charge on the array and thereby to provide an altered stationary conductivity pattern in the semiconductor substrate which represents the wave pattern of the propagated signal.

If a further signal is subsequently propagated along the surface of the piezoelectric substrate, it interacts with the altered stationary conductivity pattern representing the stored signal and provides an output signal at an appropriate electrode of the semiconductor substrate, which output signal represents either the correlation or the convolution of the stored signal with the further signal depending on which direction the further signal is propagated.

The use of Schottky diodes in such configuration provides forward charging or write times as short as $10^{-9}$ seconds and reverse bias "storage" times of about 0.1 seconds, as compared to the structures suggested prior thereto which produced write times of as long as 0.1 to 1 microseconds and storage times of only 0.1 to 1 milliseconds. Despite such improvement, however, it is desirable to provide even better performance, particularly in producing devices having even longer storage times at least an order of magnitude longer, e.g., as high as 1.0 second or more.

BRIEF SUMMARY OF THE INVENTION

In accordance with this invention, the overlay of successive signals is achieved by the use of a highly resistive amorphous material, such as a polycrystalline silicon film overlay to form such islands instead of the highly conductive metallic islands used in the above-discussed configuration. Such structure provides a second storage medium with significantly longer storage times then the forward bias diodes without significantly affecting the write times when using Schottky diodes.

Further, the use of a combination of Schottky diodes and highly resistive polycrystalline silicon islands permits the storage of signals which may have a significant undesirable noise content by permitting the successive overlaying of such signals in a manner which causes the noise to signal ratio to be reduced considerably so that the stored signal to noise ratio is maximized and the ultimate charge on the diodes is also maximized.

Further, the invention permits the simultaneous storage in the same diode array of a plurality of signals which, for example, may all be different signals, such storage sometimes hereinafter referred to as "holographic" storage. Simultaneous signal storage can be achieved, for example, by applying the signals to the piezoelectric surface in a plurality of different directions using a plurality of different transducers suitably displaced from each other by using coded storage techniques for applying signals at the same transducer.

Particular embodiments of the invention are discussed in more detail below with the help of the accompanying drawings, wherein FIG. 1 depicts a signal processing device representing one embodiment of the invention;

Figure 1:
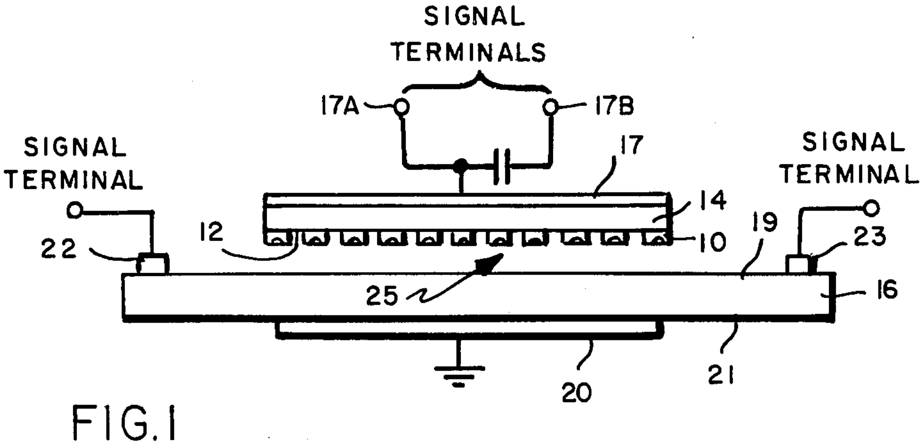
Figure 2:
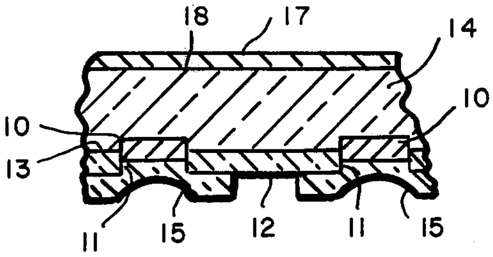
FIG. 2 depicts a more detailed sectional view of a portion of the embodiment of FIG. 1.

FIGS. 1 and 2 depict a preferred embodiment of the invention wherein an array of platinum silicide Schottky diodes 10 are formed in openings 11, each typically from 1 to 5 micrometers in diameter, in a thermally grown silicon dioxide ($SiO_2$) layer 12 formed on a selected surface 13 (e.g., the 100 surface) of a substrate 14 of n-type silicon having a resistivity, for example, of 30 ohm-centimeters. An island, or overlay, 15 made of a highly resistive material, such as a film of polycrystalline silicon, for example, is then formed over each diode within said openings and over a portion of the layer 12 in order to increase the electrical capacitance of the diode. The polycrystalline silicon material, which for convenience is referred to as "polysilicon" material, may be suitably deposited directly on the diode and $SiO_2$ surfaces by an known deposition techniques.

Figure 4:
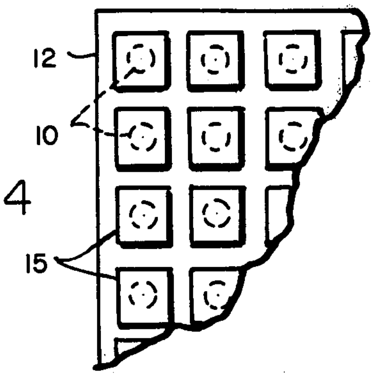
FIG. 4 depicts a plan view of a portion of the device of FIG. 1.

A typical diode island arrangement is shown in plan view in FIG. 4, wherein a plurality of square shaped Schottky diode 10 and polysilicon islands 15 are placed on silicon dioxide layer 12 in a rectangular array, for example. The array, however, need not be limited to such configuration nor need the diode configurations themselves be so limited for some applications of the device.

In a typical embodiment of the invention, for example, the period of the Schottky diode array pattern provides for one diode about every 13 micrometers thereby providing about 2½ diodes per wavelength of an acoustic signal at a center frequency of about 110 MHz. The length of the silicon substrate in a typical embodiment may be about 3.5 centimeters (cm.), corresponding to a transit time of about 10 microseconds. The silicon substrate is placed adjacent the upper surface 19 of the piezoelectric substrate 16 in a manner substantially the same as that described in the above Electronics Letters article of Mar. 7, 1974, with reference to the semiconductor/piezoelectric substrate combination shown therein, an output signal being obtainable at a conductive electrode 17 in the form of a conductive metal layer placed on the opposite surface 18 of the silicon substrate. An interaction region 25 comprising the regions at or near the surfaces 13 and 19 and the spatial region therebetween is thereby present in the overall structure.

In order to store a signal which is propagated along the surface 19 of the piezoelectric substrate 16, the Schottky diodes 10 are forward biased by a very short voltage pulse (in effect an "impulse" signal) applied across the interaction region by applying such signal across the overall structure from a signal terminal 17A of the conductive electrode 17 at the silicon substrate surface 18 to the electrode 20 at the lower conductive surface 21 of the piezoelectric substrate (e.g., a lithium niobate substrate) the application thereof forming a uniform charge on each of the diodes of the array. A surface acoustic wave is propagated so as to travel along the surface 19 of the piezoelectric substrate from a signal input transducer 22 by the application of an electric signal at the signal terminal of transducer 22. The electric fields which are present as a result of the propagation of such surface wave along the piezoelectric substrate will interact with the uniform electric field in the interaction region present because of the uniformly applied signal so as to induce proportional charges on the diodes of the Schottky diode array which charges depend on the amplitude of the surface wave adjacent thereto. The uniform charge which has been place thereon by the short voltage pulse is thereby altered accordingly.

The overall altered charge pattern thereby accumulated on the diodes will reverse bias the diodes, after the short voltage pulse is removed, and the charge will remain on the diodes for a period of time determined by the time constant thereof, i.e., by the time of the current decay through the reverse biased diodes. After the charging process, the underlying silicon 14 at surface 13 will be fully depleted to a depth proportional to the overall altered charge thereby forming an altered stationary conductivity pattern in the silicon substrate which represents the wave form of the signal which has been propagated along the surface 19 and which is thereby stored.

Figure 3:
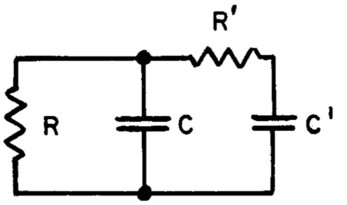
FIG. 3 depicts an equivalent circuit of the device of FIG. 2.

The equivalent circuit of diode/island portions of FIGS. 1 and 2 is shown in FIG. 3, the Schottky diode 10 being electrically equivalent to a circuit having the form of a parallel combination of a resistance R and capacitance C, as shown therein, and the polysilicon island 15 providing an electrical equivalent of an additional resistance R′ and capacitance C′, further in parallel therewith, the capacitance C′ being substantially larger than the capacitance C. When a signal is to be stored in the silicon substrate, the forward bias signal is applied so as to charge the Schottky diode capacitance C. The charging time depends on the forward bias time constant of the diodes which in the embodiment shown can be as fast as one nanosecond (1 nsec.).

The charge on the diode capacitance C is thereupon transferred to the capacitance C′, the charge transfer time depending on the R′ C′ time constant. In a typical embodiment, such transfer time will be about 1 microsecond. The charge can remain temporarily stored, when the forward bias signal is removed and the Schottky diode becomes reverse biased. The storage time, i.e., the charge decay time, will depend on the reverse bias time constant of the overall circuit, such decay time being typically about 0.1 second, or more.

In the case where highly conductive islands are used, such as the gold islands discussed in the above-mentioned articles of Ingebrigtsen et al. of June 1, 1975, and the copending application, Ser. No. 690,601, if a second signal is applied to forward bias the diodes while the first charge is still temporarily stored, the stored charge will immediately decay and be lost. Accordingly, if the diodes are successively charged by the same signal, for example, each successively applied signal will cause the previously charged signal to discharge immediately and it is not possible to build up the charge as each successive signal is applied.

In the case of the present invention, however, it is possible to do so, as is explained more fully below in conjunction with the curve of FIG. 5. As mentioned above, the use of a highly resistive material, such as polycrystalline silicon having a sheet resistance as high as $10^{10}$ ohms/square, for example, in effect inserts a resistance R′ in the equivalent circuit as shown in FIG. 3. When the diode is forward biased the diode capacitance C is charged in 1 nanosec. and such charge is thereupon transferred to the polysilicon island capacitance C′ is about 1 microsec. If a subsequent forward biasing signal is applied to the diode before the transferred charge on C′ decays (i.e., within 0.1 second), the diode capacitance C is again charged in 1 nanosec., but because of the presence of resistance R′, the previous charge on C′ will not be discharged through the forward biased diode and will remain on C′. The newly applied charge on C will thereupon transfer to the previously charged capacitance C′ and will in effect add to the charge thereon. Further charging of the diode by subsequently applied signals will cause the charge on C′ to build up over the time period during which such subsequent signals are applied.

Figure 5A:
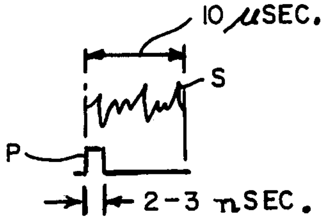
FIG. 5A depicts the signal to be overlaid and the charging pulse signal therefor in connection with the graph of FIG. 5.
Figure 5:
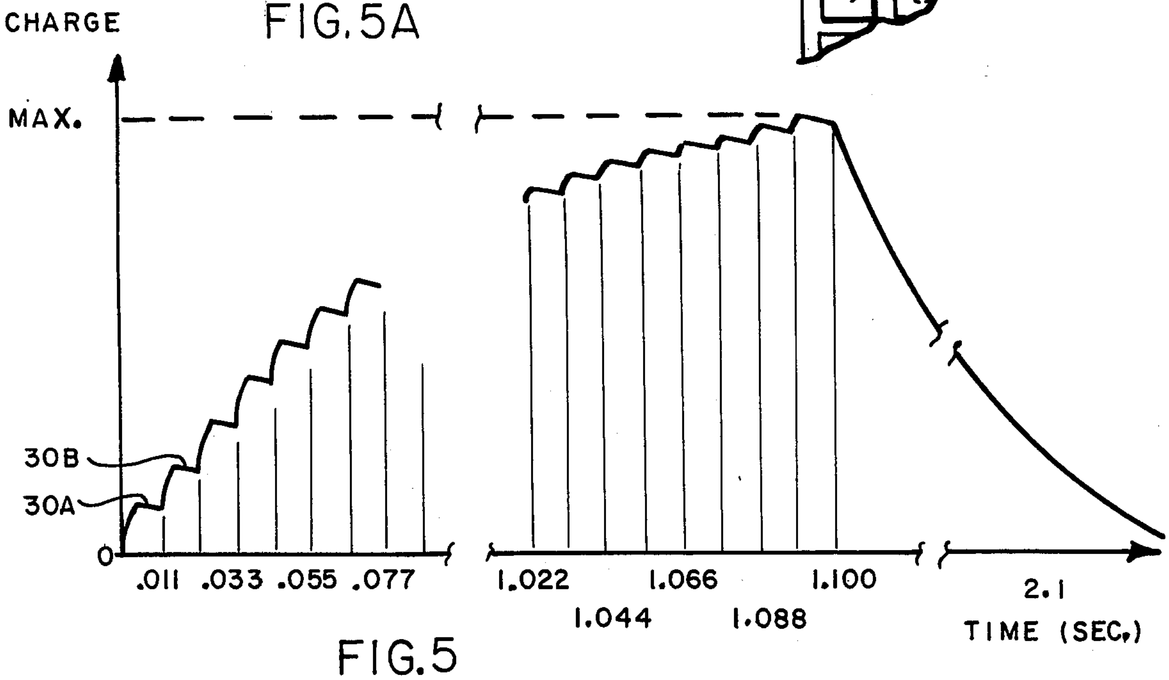
FIG. 5 depicts a graphical representation of a charging curve when using the device of FIG. 1 for overlaying of signals.

Such operation can be understood with the help of FIGS. 5 and 5A for a situation in which it is desired to overlay an input signal S which occurs in 10 microsecond bursts, such signal having a 100 MHz bandwidth, for example. If an initial 10 microsecond burst of signal S (as shown in FIG. 5A) is applied to the piezoelectric substrate 16, and a relatively short charging pulse P, e.g., having a time duration of a few nanoseconds (as in FIG. 5A), is applied to all of the diodes simultaneously at signal terminal 17A in order to forward bias the diodes when the signal S travelling on piezoelectric surface 19 is opposite the diode array, the diode capacitances C will be charged in 1 nanosec. in accordance with the amplitude of the signal S opposite thereto. The charges on the diodes will thereupon be transferred to the capacitances C′ within about 1 microsecond. The transferred charge on a particular diode can be represented by the initial portion 30A of curve 30 as shown in FIG. 5.

If another burst of signal S is applied to the piezoelectric substrate at approximately 11 microseconds later and a subsequent short charging pulse is again applied to signal terminal 17A, the diodes are again charged and the charge is transferred to capacitance C′. Because of the presence of resistance R′, substantially all of the initial charge on C′ remains and the new charge which is transferred thereto adds to the previous charge to build up the total charge to a new level 30B as shown in FIG. 5.

Each subsequent re-charging which occurs upon the overlaying of the signal S at approximately 11 microsecond intervals for as many as 100 overlays, for example, builds up the charge on C′ until the total charge approaches the maximum level in an asymtotic manner, as shown by curve 30. If the charging operation is then terminated, the maximum charge decays as shown by curve portion 30C in about 0.1 second in accordance with the normal discharge time of the Schottky diodes.

In performing the signal overlay operation described above, it is necessary that the successive charging signals be applied at time intervals which are much shorter than the reverse bias decay time.

One important advantage of using such an overlay process in order to store a signal lies in the improved signal to noise ratio which results. Thus, if the original signal S has a relatively high noise content, the signal content will be reinforced or build up, during each charging interval while the noise content will tend to cancel. Accordingly, the stored signal to nose ratio $S_s/N_s$ can be maximized by implementing a large number of signal overlays with appropriate short charging pulse signals P. The available signal to noise ratio $S_o/N_o$, i.e., the ratio of signal to noise which is present in the stored signal when it is subsequently read out, can be maximized by assuring that the stored signal is built up to its maximum level. Such a situation can occur provided that the signal burst are sufficiently short to permit the necessary number of overlays to be used so that maximum charging occurs before the original charge beings to decay.

Once the altered stationary conductivity pattern representing a stored signal has been established, a further signal can be applied to the input terminal of transducer 22, for example, which signal as it propagates along the surface 19 of piezoelectric substrate 16 effectively interacts with the stored signal to produce an output signal at the terminal 17B of electrode 17 which is the correlation of the stored signal and the further signal. In a similar manner, a further signal can be applied to the input signal terminal of a transducer 23 at the opposite end of piezoelectric substrate 16 to produce a travelling wave signal which propagates in the opposite direction from a signal applied at transducer 22. Such an oppositely directed travelling wave signal will interact with the stored altered conductivity pattern (i.e., the stored signal) to provide a signal at terminal 17B of electrode 17 which is the convolution of the stored signal with the further signal.

The original stored signal in the process described above is essentially the signal which has been propagated along the surface of the piezoelectric substrate because it has interacted with the very short signal uniformly applied to the device. The uniformly applied signal may be a d-c pulse of very short duration, that is, the time width thereof should be less than $\frac{1}{2}f_o$, where $f_o$ is the center frequency of the traveling acoustic wave signal propagated along the piezoelectric substrate. Such signal may also be a short a-c pulse, the a-c signal having a frequency $f_o$ the same as such center frequency and a time duration which is less than $\frac{1}{2}W_o$, where $W_o$ is the band-width of the travelling acoustic wave signal, as disclosed in the above-mentioned article of Bers et al. and in the above-mentioned copending patent applications.

If the uniformly applied signal is other than a very short pulse signal, that is, a signal having a center frequency $f_1$ and a different bandwidth $W_1$, the stored altered conductivity pattern will represent the convolution of such signal with the travelling acoustic wave signal. In any event a subsequent travelling acoustic wave signal propagated along the piezoelectric substrate will interact with the stored signal and produce a correlation signal or a convolution signal depending on its direction of propagation as discussed above.

The altered conductivity pattern of any signal which is stored in the device of the invention which uses a Schottky diode array and polysilicon island configuration is a substantially precise replica of the acoustic wave present on the propagating surface of the piezoelectric substrate, including the amplitude and phase thereof. In addition, the spatial configuration of the acoustic wave fronts is stored, as well, if a two-dimensional diode array is used with a spacing between diodes which is less than a wavelength of the acoustic wave.

It is possible to store orthogonal acoustic beams in diode arrays in a manner such that a subsequent signal propagating down a beam will interact only with a previously stored reference in that particular beam, but not with any other, even though the beams occupy substantially the same space. One technique for providing such simultaneous signal storage is described with reference to the structure shown in FIG. 6, which shows a plan view looking downward on a device of the invention which comprises a first piezoelectric substrate 40 having a surface 41 on which acoustic waves can be appropriately propagated and a silicon substrate 42 positioned adjacent such substrate surface in substantially the manner discussed with reference to FIG. 1, for example, In the configuration shown, the silicon substrate is configured to have a substantially dual-flared shape, as depicted therein, although the particular shapes of both the piezoelectric and the silicon substrates need not be limited to those specifically shown in FIG. 6. As can be seen therein, a first plurality of transducers 43 (e.g., the seven transducers shown at the left in the specific embodiment depicted) are positioned at one end of piezoelectric substrate 40 and a second plurality of seven transducers 43 (the sevel transducers shown at the right) are positioned at the other end thereof.

The surface (not shown) of the silicon substrate 42 which is adjacent the propagating surface 41 of piezoelectric substrate 40 is of the type depicted by surface 13 of the silicon substrate shown in FIG. 1 and has a two-dimensional array of Schottky diodes and polysilicon islands disposed thereon in the manner discussed above with reference to FIG. 1. The transducers 43 are positioned so that the signals which are propagated therefrom along surface 41 of the piezoelectric substrate 40 each travel along distinctly different beams, the general directions and the orientation of the wave fronts thereof depending on the location and configuration of the transducers at one or the other end of piezoelectric substrate 40. The tilting of the direction of such signals relative to each other produces an effective orthogonality between such signals, which orthogonality then minimizes the cross-talk which tends to occur therebetween. If the wavelength of all of the signals which are stored is the same, substantially perfect orthogonality can be achieved and substantially no cross-talk occurs. If all of the signals have substantially the same relatively small and finite band-width such perfect orthogonality condition can be approximated so that any cross-talk which does arise is minimized. However, if signals of relatively large band-widths are stored, the cross-talk increases and appropriate techniques must be utilized for the reducing of such cross-talk to acceptable levels.

One such technique for suppressing cross-talk is to use a weighted intensity of the signal beam across the beam width at the transducer. For example, the weighted distribution of intensity may be in accordance with a Gaussian distribution of the signal amplitude across the beam width at the transducer for each of the signals which are propagated therefrom. The use of a Gaussian intensity distribution tends to reduce the cross-talk considerably from that which arises when using beams of uniform intensity thereacross. Thus, when a stored signal is read out, the contributions thereto from other stored signals which are overlapped with respect to the signal which is being read out is effectively reduced. While the specific implementation shown in FIG. 7 utilizes fourteen transducers, it is clear that the device is not limited thereto and a large numer of transducers and diodes may permit storage of larger number of signals, as desired.

Another technique for storing a plurality of signals which does not require multi-directional signal beams is to utilize coded signal wave front techniques in order to store a plurality of signals which can be propagated substantially along the same direction. such signals are propagated in a manner such as to employ a plurality of different orthogonal propagation modes along the same beam direction so that such signals can be subsequently read out separately without interference with one another.

Figure 7:
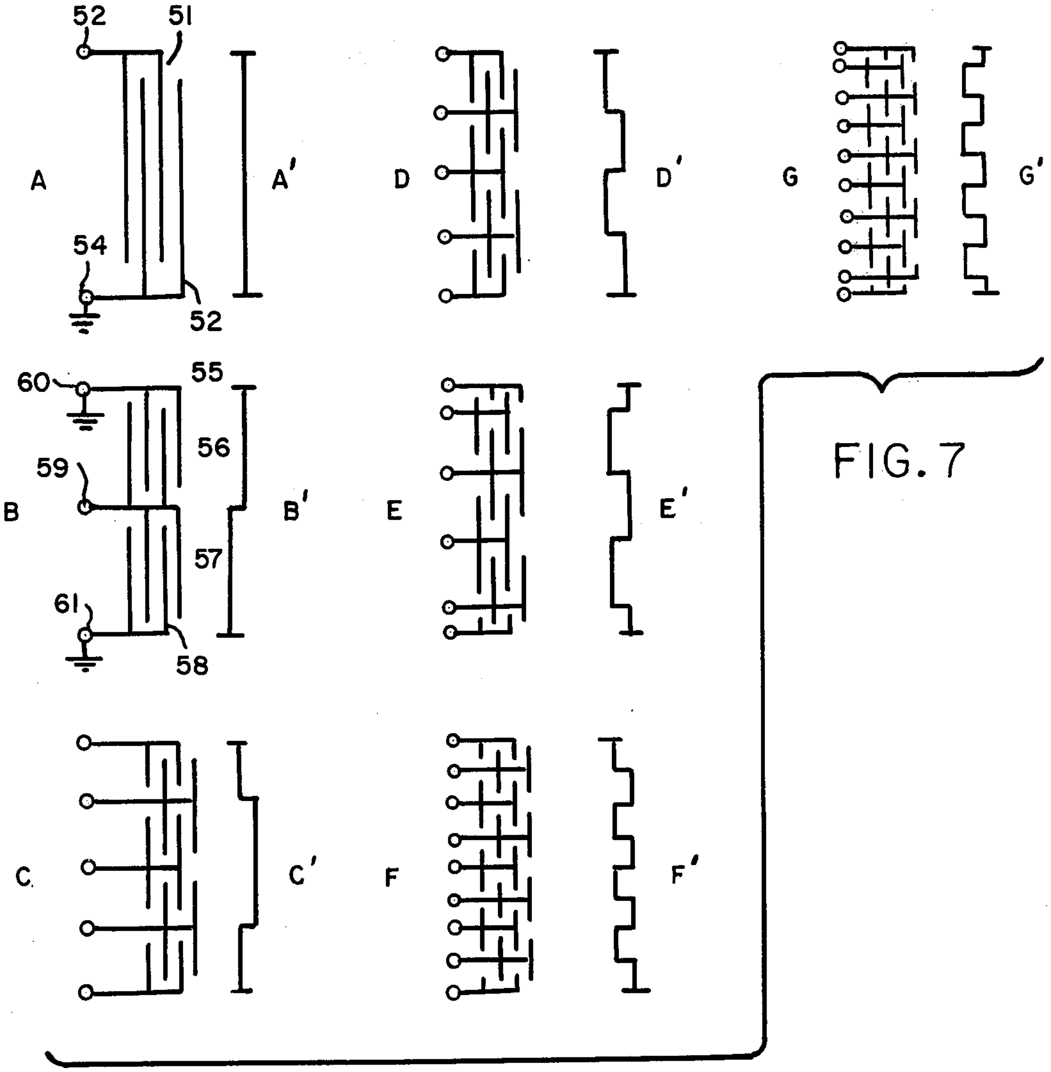
FIG. 7 depicts a plan view of a device of the type shown in FIG. 1 wherein holographic storage is achieved by coded storage techniques.

Suth orthogonality can be achieved by utilizing a transducer configuration which introduces phase reversals of the beam at selected point across the beam width as shown in FIG. 7. The phase reversals are created by reversing the interdigital finger connectors of the transducer configuration in an appropriate manner so as to provide isilation between the orthogonal modes over a relatively wide band-width. Thus, in a typical embodiment shown in FIG. 8, a transducer configuration is arranged so as to include a plurality of transducers capable of propagating a plurality of different wave front patterns which are orthogonal with respect to each other. Orthogonality is achieved by providing for phase reversals which displace one or more portions of the wave front relative to the remaining portions thereof, such phase reversals being appropriately selected in a coded manner. Thus, each signal which is to be stored has a unique wave front pattern which provides operation in a mode which is orthogonal with respect to each other unique wave front pattern.

For example, the plurality of different transducers, each for generating a particular orthogonal mode, are positioned in alignment at one end of the propagation surface of the piezoelectric substrate. In a typical example, seven such transducers can be used to provide seven orthogonal signals. Such transducers are shown in more detail in FIG. 7 wherein the transducers 50 are designated by reference letters A through G in association with the wave front patterns A′ through G′ which are generated by each. Such wave front patterns are achieved by providing appropriate interdigital finger connections which produce spatial phase reversals of the signals which are placed thereon so that the seven different wave front modes are appropriately propagated. Thus, as can be seen in FIG. 7 with respect to transducer A, such transducer comprises a first plurality of interdigital fingers 51 connected to an input terminal 52, each extending in a first direction, and a second plurality of interdigital fingers 53 connected to a second terminal 54, each extending in the opposite direction between fingers 51. A signal applied across the terminals thereupon provides a wave front pattern A′ which is uniform across the entire beam as shown and identified as the O-model signal.

Transducer B comprises four sets of interdigital fingers 55, 56, 57 and 58, fingers 56 and 58 being commonly connected to a midterminal 59 of the transducer, while fingers 55 are connected to a terminal 60 at one side of the transducer and fingers 58 are connected to a terminal 61 on the opposite side thereof. If terminals 60 and 61 are, in effect, grounded and terminal 59 is treated as the ungrounded signal side, a signal applied from terminal 59 to each of the grounded terminals produces a wave front pattern B′, such wave front having a single spatial phase reversal at its midpoint, identified as a $1_O$-mode signal.

Transducer C, for example, utilizes five terminals with appropriately connected interdigital fingers arranged with respect to each other so as to produce the wave front pattern C′ having two spatial phase reversals and identified as the $1_e$-mode. In a similar manner transducers D, E, F and G produces wave front patterns D′, E′, F′ and G′ as indicated. Such patterns are often identified mathematically as Walsh functions. Cross-correlation amplitudes between one mode and any of the others is essentially zero if the center frequency of the signals which are propagated are substantially the same and the displacement of the wave fronts is arranged so that the period of the transducer matches such center frequency wave length.

Figure 6:
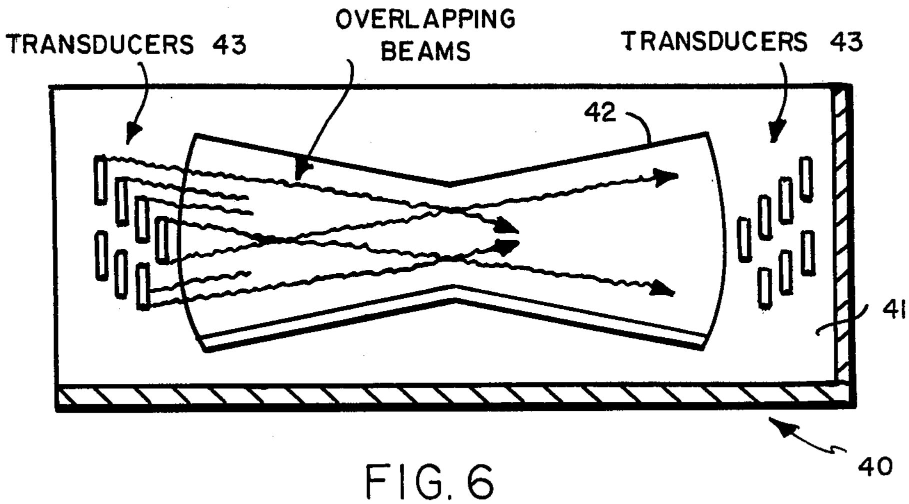
FIG. 6 depicts a plan view of a device of the type shown in FIG. 1 wherein holographic storage is achieved using a plurality of displaced signals.

If, for example, seven orthogonal wave front modes produced as shown in FIG. 7 are utilized with respect to each of the fourteen directions shown in FIG. 6, 98 separate signals can be stored in the same Schottky diode array. Each data stream has a capacity as high as 1000 6-bit words of information. Accordingly, for 98 beams 98,0006 -bit words, or 588,000 bits of data can be stored in an area determined by the wave length λ of the center frequency of the band width of the signals involved. A typical device of the invention may have, for example, a diode array occupying an area 100λ in width and 3000λ in length, providing a total area of $3 \times 10^5\mu^2$. For a typical wavelength of $10^{-2}$cm., the area thereof is 0.3 cm.$^2$. Accordingly, 588,000 bits can typically be stored in such area, thereby providing a storage capacity of greater than $10^6$/cm.$^2$.

For the write times, storage times, and storage capacities discussed above, the device of the invention can find appropriate use as a digital buffer memory element which has very high input and output data rates and large storage capacity. Thus, the input data rate of such a device may typically be $10^8$ bits/second, with the output data rate substantially the same, or less. The access time will be typically about 200 microseconds and, as mentioned above, the storage capacity typically can be as high as $10^6$ bits/cm.$^2$. The intrinsic storage time is about 0.1 seconds and can be further increased by appropriate refreshing of the stored data.

In a typical embodiment of the invention, the Schottky diode array may comprise as many as $3 \times 10^6$ Schottky diode and, since the storage of each word of information is distributed among about 3000 diodes, randomly distributed defects among the diodes will generally be of little significance. Thus, the cost of manufacturing such a memory relative to other kinds of memory may be reduced, particularly where the yields in such manufacture are improved to provide a minimum number of diode defects per device. Since techniques for providing diode arrays in general have been developed for applications other than for the specific structures described herein, e.g., for producing silicon diode targets for vidicon operations, such techniques can be readily adapted for use in the manufacture of devices in accordance with the invention.

The above embodiments discuss the storage of one or more signals wherein a signal to be stored is applied at a transducer for propagation along the surface 16 of the piezoelectric substrate 16 and a short voltage pulse, for example, is applied across the interaction region by being applied between the conductive electrode 17 of the silicon substrate 14 at terminal 17A and the conductive electrode 20 of the piezoelectric substrate. However, signal storage can also be achieved with the embodiments of the invention by applying the signal to be stored across the interaction region between electrodes 17 and 20 and by applying a short a-c voltage pulse at a transducer for propagation along the surface of the piezoelectric substrate. Interaction of such applied signals also produces the desired altered stationary conductivity pattern.

Further, any two different signals can be applied at a transducer and at terminal 17A to provide a stored signal which represents the interaction thereof. That is, either the correlation interaction signal or the convolution interaction signal — depending on the direction of the signal which is propagated along the piezoelectric substrate.

Further, once a signal is stored in the silicon substrate, a signal representing the correlation or the convolution thereof with another signal can be obtained by applying the latter signal at one of the transducers, a correlation or a convolution operation occurring depending on the direction of propagation of each latter signal. Alternatively, the latter signal can be applied across electrodes 17 and 20 and the resultant interaction thereof with the stored signal produces travelling acoustic waves in both directions along the surface of the piezoelectric substrate, the correlation or convolution of such signals being available at the transducers depending on direction of travel.

While the invention has been described in terms of the specific embodiment discussed above, modifications thereof within the scope of the invention may occur to those in the art and the invention is not deemed to be limited to the specific embodiments shown, except as defined by the appended claims.

What is claimed is:

1. A device for processing and storing signals comprising a first piezoelectric substrate capable of propagating acoustic wave signals on a selected surface thereof;

at least one transducer means formed on said selected surface for generating surface acoustic waves travelling on said surface along a selected direction thereof in response to electrical signals;

a semiconductor material positioned so as to have a first surface thereof adjacent and spaced from said selected surface of said first substrate to form an interaction region which includes the region at or near said surfaces and the spatial region therebetween;

an array of diode elements disposed at said first surface;

an array of islands corresponding to and disposed over said diode elements and regions adjacent thereto, said islands being formed of a highly resistive material;

a layer of conductive material disposed on a second surface of said semiconductor material, said layer forming an electrode;

at least one means for providing a signal at said at least one transducer means to produce at least one travelling acoustic wave signal along said selected surface of said first substrate; and means for applying a second signal uniformly over said interaction region to provide time-varying properties thereof for the interaction of said at least one signal and said second signal thereby producing a spatial charge variation among said diodes so as to provide an altered stationary conductivity pattern in said semiconductor material as said acoustic wave signal travels along said selected surface of said first substrate, said altered stationary conductivity pattern being stored in said semiconductor material and representing said interacted at least one and second signals.

2. A device in accordance with claim 1 wherein said diodes are Schottky diodes.

3. A device in accordance with claim 2 wherein said semiconductor material is silicon and further including a layer of silicon dioxide, and Schottky diode being formed in openings in said layer.

4. A device in accordance with claim 3 wherein said highly resistive material is a polycrystalline silicon material.

5. A device in accordance with claim 2 and further including means for providing a third signal at one of said at least one transducer means to produce a second travelling acoustic wave signal along said selected surface of said first substrate after said altered stationary conductivity pattern has been so stored;

said conductive layer disposed on said second surface of said semiconductor material forming an electrode;

whereby the interaction of said second acoustic wave signal with said stored altered stationary conductivity pattern produces an output signal at said electrode.

6. A device in accordance with claim 5 wherein said third signal is provided at the same transducer means as that of said first signal, said second acoustic wave signal traveling in the same direction as said first acoustic wave signal whereby said output signal is a real-time correlation of said third signal with said altered stationary conductivity pattern.

7. A device in accordance with claim 5 wherein said third signal is provided at a different transducer means from that of said first signal for generating an acoustic wave signal traveling in the opposite direction from that of said first acoustic wave signal whereby said output signal is a real-time convolution of said third signal with said altered stationary conductivity pattern.

8. A device in accordance with claim 2 wherein said second signal is a pulse signal having a time duration selected so that said stored altered stationary conductivity pattern represents said first signal.

9. A device in accordance with claim 5 wherein said first signal providing means provides said first signal a selected number of times over a selected time interval; and said second signal applying means applies said second signal the same selected number of times over said selected time interval whereby the charge on said diodes increases over said time interval.

10. A device in accordance with claim 9 wherein said second signal is a pulse signal having a time duration substantially less than that of said first signal.

11. A device in accordance with claim 10 wherein said pulse signal is a d-c pulse signal having a time duration less than $\frac{1}{2}f_o$, where $f_o$ is the center frequency of said first signal.

12. A device in accordance with claim 10 wherein said second signal is an a-c pulse signal having a center frequency substantially the same as that of said first signal and having a time duration which is less than $\frac{1}{2}W_o$ where $W_o$ is the band width of said first signal.

13. A device in accordance with claim 5 wherein said at least one transducer means comprises a plurality of transducer means for generating a plurality of surface acoustic wave beams along a plurality of different selected directions on said surface; and said at least one signal providing means comprises a plurality of signal providing means for providing a plurality of electrical signals at said plurality of transducer means to produce a plurality of travelling acoustic wave signals along said plurality of different selected beam directions on said surface.

14. A device in accordance with claim 13 wherein said plurality of travelling acoustic wave signals along different beam directions have different bandwidths and further including means for weighting the amplitude distributions across each of the said plurality of travelling acoustic wave beams in accordance with a preselected weight distribution characteristic to reduce the interaction of said plurality of travelling acoustic wave signals with each other.

15. A device in accordance with claim 14 wherein said preselected weight distribution characteristic is a Gaussian distribution of said signal amplitudes across said beam widths.

16. A device in accordance with claim 5 wherein said at least one transducer means comprises a plurality of transducer means for generating a plurality of surface acoustic wave beams along substantially the same direction on said surface;

said at least one signal providing means comprises a plurality of signal providing means for providing a plurality of electrical signals at said plurality of transducer means to produce a plurality of travelling acoustic wave signals along said same beam direction on said surface, said plurality of transducer means having different preselected configurations for providing different wave front characteristics across the widths of the surface acoustic wave beams generated thereby to produce acoustic wave signals having different orthogonal propagation modes.

17. A device in accordance with claim 16 wherein the configurations of said transducer means are arranged to introduce phase reversals of the acoustic wave signals at selected points across the beam widths so that one or more portions of the wavefront of said acoustic wave signals are displaced relative to the remaining portions thereof, the patterns of said phase reversal points at said plurality of transducer means differing from each other.

* * * * *